(12) United States Patent
Li et al.

(10) Patent No.: US 7,710,020 B2
(45) Date of Patent: May 4, 2010

(54) ORGANIC ELECTROLUMINESCENCE DEVICE AND METHOD FOR REDUCING LATERAL CURRENT LEAKAGE THEREOF

(75) Inventors: Hsing-Chuan Li, Hsinchu (TW); Chung-Chun Lee, Hsinchu (TW)

(73) Assignee: AU Optronics Corporation, Hsincho (TW)

( * ) Notice: Subject to any disclaimer, the term of this patent is extended or adjusted under 35 U.S.C. 154(b) by 555 days.

(21) Appl. No.: 11/645,852

(22) Filed: Dec. 27, 2006

(65) Prior Publication Data

US 2008/0007169 A1 Jan. 10, 2008

(30) Foreign Application Priority Data

Jul. 5, 2006 (TW) .............................. 95124480 A

(51) Int. Cl.
*H05B 33/00* (2006.01)

(52) U.S. Cl. .................. 313/504; 313/506; 428/917

(58) Field of Classification Search ................ None
See application file for complete search history.

(56) References Cited

U.S. PATENT DOCUMENTS

| | | | |
|---|---|---|---|
| 6,180,963 B1 * | 1/2001 | Arai | 257/103 |
| 6,288,487 B1 * | 9/2001 | Arai | 313/506 |
| 2007/0247066 A1 * | 10/2007 | Tokairin et al. | 313/506 |

FOREIGN PATENT DOCUMENTS

| | | |
|---|---|---|
| CN | 1437773 A | 8/2003 |
| EP | 1041654 A1 | 4/2000 |
| JP | 6005369 A | 1/1994 |
| JP | 2002083690 A1 | 3/2002 |
| TW | 443075 | 6/2001 |
| TW | 463524 | 11/2001 |
| TW | 548859 | 8/2003 |
| TW | 575967 | 2/2004 |
| WO | 0199207 A2 | 12/2001 |

OTHER PUBLICATIONS

Office Action, dated Nov. 27, 2009, received in Taiwanese Patent Application No. 095124480, 6 pgs.

* cited by examiner

*Primary Examiner*—Ashok Patel
(74) *Attorney, Agent, or Firm*—Holland & Knight LLP; Brian J. Colandreo, Esq.; Mark H. Whittenberger

(57) ABSTRACT

An organic electroluminescence device and a method for reducing lateral current leakage thereof are provided. The organic electroluminescence device comprises a cathode, an anode, and an organic electroluminescence unit disposed therebetween. The organic electroluminescence unit comprises a light-emitting layer and a hole-injecting layer (HIL). The HIL possesses a sufficient resistance achieved by adjusting the thickness of the HIL and/or the concentration(s) and/or species of the conductive dopant(s) in the HIL.

8 Claims, 4 Drawing Sheets

ORGANIC ELECTROLUMINESCENCE DEVICE AND METHOD FOR REDUCING LATERAL CURRENT LEAKAGE THEREOF

This application claims the benefit from the priority of Taiwan Patent Application No. 095124480 filed on Jul. 5, 2006, the disclosures of which are incorporated by reference herein in their entirety.

BACKGROUND OF THE INVENTION

1. Field of the Invention

The present invention relates to an organic electroluminescence device. In particular, the invention relates to an organic electroluminescence device with a reduced lateral current leakage.

2. Descriptions of the Related Art

Since organic electroluminescence devices with high brightness had been developed by Tang etc. in 1987, organic electroluminescence devices for use in displays has caught a lot of attention. Various researches and developments have been successively carried out in industries and academies.

FIG. 1 is a schematic view illustrating a conventional organic light emitting diode (OLED) display 1 which comprises a plurality of pixel areas 10. On each pixel area 10, a thin-film-transistor (TFT) 11 and an organic electroluminescence device 13 are disposed. Furthermore, a plurality of scan lines 15 and data lines 17 are utilized to control the display 1.

FIG. 2 illustrates a cross-sectional view of each pixel area 10. When voltages applied from the scan lines 15 turn on the TFT 11, the organic electroluminescence device 13 will be subsequently driven to emit light through a transparent electrode 21 and an organic electroluminescence unit 30 on a luminescence area 131.

FIG. 3 is an enlarged view illustrating the organic electroluminescence device 13 within the broken circle as shown in FIG. 2. The organic electroluminescence device 13 comprises the transparent electrode 21 (acting as an anode), the organic electroluminescence unit 30, and a common electrode 23 (acting as a cathode). The organic electroluminescence unit 30 successively comprises a hole-injecting layer (HIL) 31, a hole-transporting layer (HTL) 32, a light-emitting layer 33, an electron-transporting layer (ETL) 34, and an electron-injecting layer (EIL) 35. In accordance with practical applications and material selections, the HIL 31, the HTL 32, the ETL 34, and the EIL 35 can be combined into a single layer, separately disposed, or alternatively not disposed in the organic electroluminescence unit 30. When specific voltages or currents are applied between the electrodes, the electron current generated from the common electrode 23 and the hole current generated from the transparent electrode 21 flow into the device. Subsequently, the electrons and the holes are both transmitted into the light-emitting layer 33 and then combined into excitons for emitting light.

Specifically, when a bias is added, the electrons and holes transmit into the light-emitting layer 33 through the ETL 34 and the HTL 32, respectively. The light-emitting layer 33 is formed by organic electroluminescent materials. After the electrons and holes combine into excitons, they turn to ground state with light emission. According to the selections of the luminescent materials and the spin state characteristics of the electrons, lights will be emitted with different colors.

In general, the conventional HIL 31 is made of hole-transporting materials doped with high concentration of P-type substances. This can improve the thermal stability of the device and enhance its hole-injecting characteristics or conductivity, so as to reduce the working voltage of the device. Although this structure can significantly enhance the hole-injecting and hole-transporting abilities of the device, it also results in lateral current leakage due to high lateral conductivities. Thus, the working efficiency of the device is also reduced.

Referring to FIGS. 2 and 3, the organic electroluminescence device 13 is generally expected to respond merely in the luminescence area 131 for displaying. However, the final products will emit light on area 132 as well due to the aforementioned lateral current leakage. This will cause serious, undesired light leakages in OLED displays.

Accordingly, it is desirable to provide an organic electroluminescence device with a reduced lateral current leakage.

SUMMARY OF THE INVENTION

One object of the present invention is to provide an organic electroluminescence device with reduced lateral current leakage. Lateral current leakage on the device can be restrained by appropriately raising the resistance of the HIL. This can ensure the device emitting light on the expected display area and effectively reduce light leakages of the OLED on each pixel area.

Another object of the present invention is to provide an organic electroluminescence device with an enhanced efficiency without affecting its working voltages, thermal stability, and/or life. The organic electroluminescence device comprises a cathode, an anode, and an organic electroluminescence unit disposed between the cathode and the anode. The organic electroluminescence unit comprises a light-emitting layer and an HIL which possesses a sufficient resistance for restraining lateral current leakage.

Still another object of the present invention is to provide a method for reducing lateral current leakage of an organic electroluminescence device. The method can restrain lateral current leakage by adjusting the HIL to have a sufficient resistance for restraining lateral current leakage.

The detailed technology and preferred embodiments implemented for the subject invention are described in the following paragraphs accompanying the appended drawings for people skilled in this field to well appreciate the features of the present invention.

DESCRIPTION OF THE PREFERRED EMBODIMENT

Figure 1:
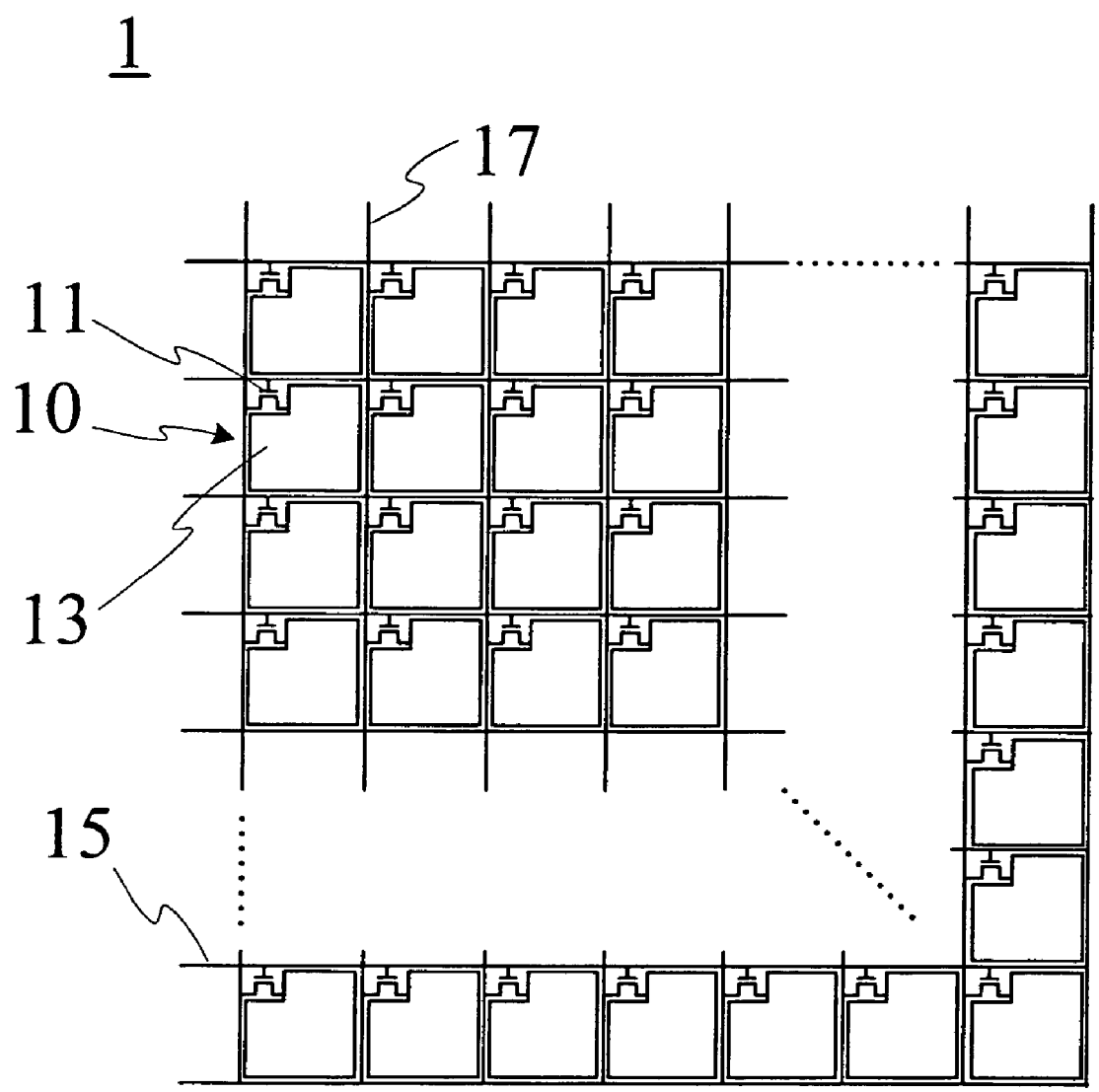
FIG. 1 is a schematic view illustrating a conventional OLED display.
Figure 2:
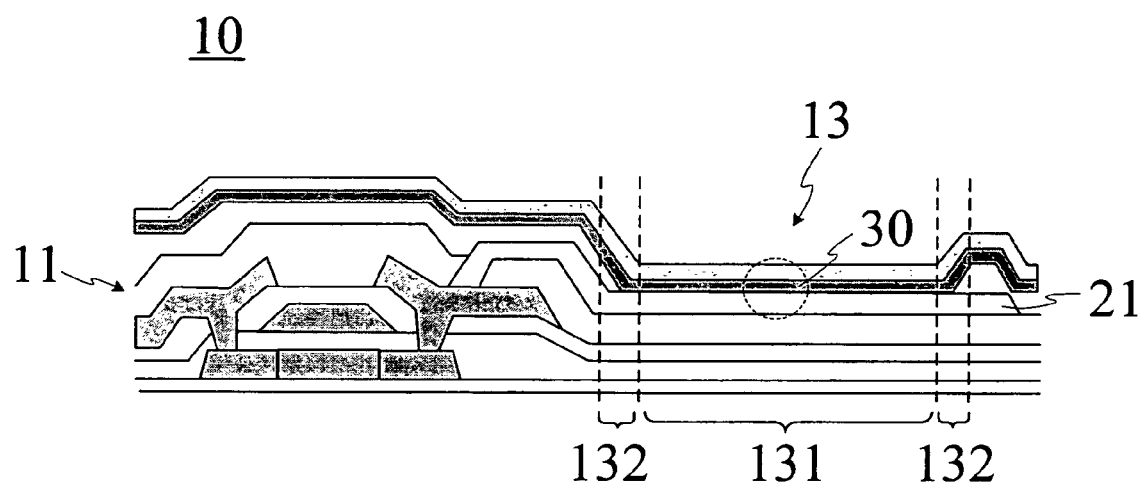
FIG. 2 is a cross-sectional view illustrating each pixel area in FIG. 1.
Figure 3:
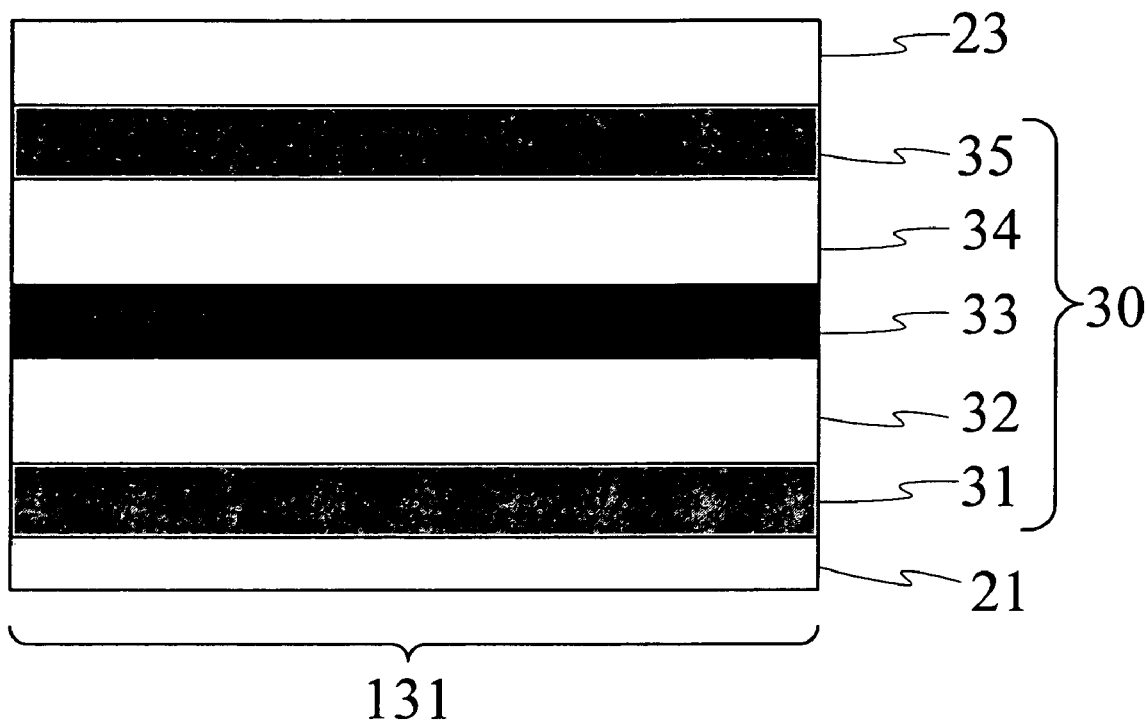
FIG. 3 is an enlarged cross-sectional view illustrating the conventional OLED on the luminescence area.
Figure 4:
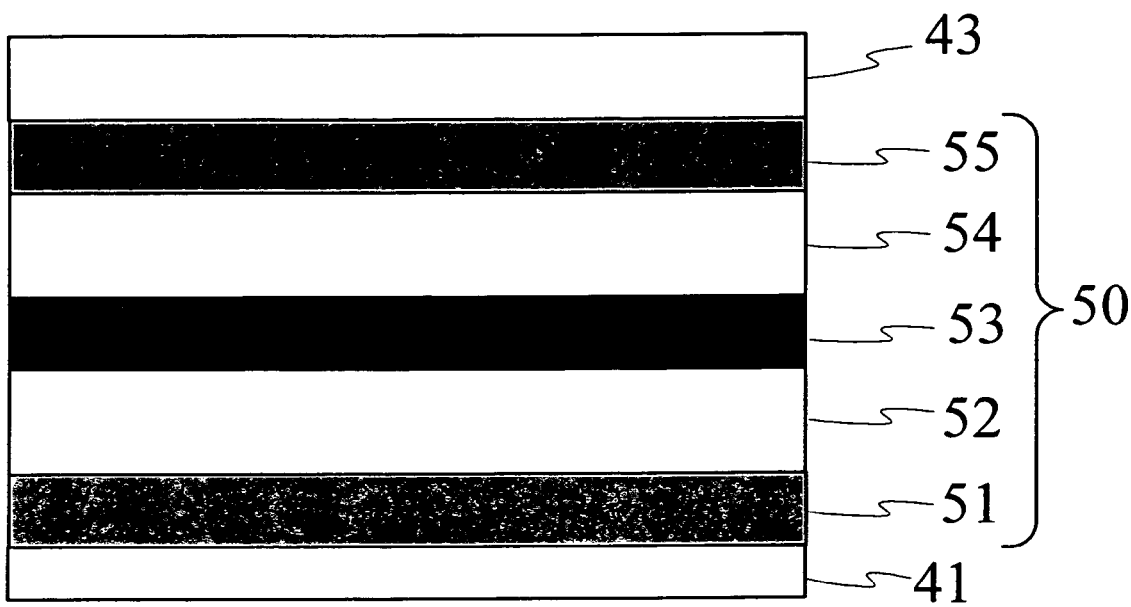
FIG. 4 is a schematic view illustrating the organic electroluminescence device of the present invention.

Referring to FIG. 4, an organic electroluminescence device 5 of the present invention is illustrated. The organic electroluminescence device 5 comprises an anode 41, a cathode 43, and an organic electroluminescence unit 50 which is disposed between the anode 41 and the cathode 43. Preferably, the anode 41 is a transparent electrode which consists of a material with a relatively high work function, for example, an indium tin oxide (ITO) electrode. The cathode 43 can be a common electrode and preferably consists of a material with a relatively low work function, for example, magnesium, magnesium silver alloy, calcium, lithium aluminum alloy, and so on.

The organic electroluminescence unit 50 comprises a light-emitting layer 53 and an HIL 51. The organic electroluminescence unit 50 may further comprise an HTL 52, an ETL 54, and an EIL 55. In manufacturing the organic electroluminescence device 5, the anode 41 is processed with an UV ozone treatment, for example, in advance. Subsequently, the ETL 54, the EIL 55, and the cathode 43 are formed on the anode 41 in order by depositing corresponding materials. The manufacture of the organic electroluminescence device 5 is completed after a packaging procedure. It is noted that the light-emitting layer 53 can be one of the three primary colors, i.e. red, green and blue (RGB), or any color in accordance with each display pixel. The HTL 52, the ETL 54, and the EIL 55 can be separately disposed, combined within a single layer, or even not existed in the organic electroluminescence unit 50.

When a bias is applied, electrons are generated from the cathode 43 and transmitted to the light-emitting layer 53 through the EIL 55 and the ETL 54. In addition, holes are generated from the anode 41 and transmitted to the light-emitting layer 53 through the HIL 51 and the HTL 52. The electrons and holes can combine into exitons within the light-emitting layer 53 and thus lead to light emission.

In the aforementioned structure, the resistance of the HIL 51 is controlled to a relatively high level. Preferably, the resistance of the HIL is higher than about 1.00E+9 ohms. This helps to reduce light leakages which result from lateral current leakage occurred in the conventional organic electroluminescence devices. Therefore, the light leaking area can be reduced to less than 5% of the original pixel area. The resistance of the layer can be changed by adjusting the thickness of the HIL, the species of dopants, and/or the concentration of dopants. In general, thickening the HIL, lowering the concentration of the conductive dopants, and/or reducing the conductivity of the conductive dopants will all bring benefit on increasing the resistance of the HIL.

For example, when F4 (i.e., fluoro-7,7,8,8-tetracyanoquinodimethane or F4-TCNQ) is used in the HIL 51 as the P-type dopant, the resistance of the HIL 51 can be effectively changed to a desired relatively high level by adjusting the concentration of the dopant to about 2~5%, preferably about 3~4%. Furthermore, when the adjustment of resistance is achieved by adjusting the thickness of the HIL 51, a thickness ranging from about 50 to 5000 angstroms (Å) can be adopted. Specifically, when using F4 as the dopant, the thickness ranges from 1000 to 2000 angstroms (Å). For example, 1500 Å can be adopted to provide a sufficient resistance.

The present invention also discloses a method for reducing the lateral current leakage of an organic electroluminescence device. The method comprises a step of adjusting the resistance of an HIL to a relatively high level, i.e., a sufficient resistance for restraining lateral current leakage. In particular, taking the aforementioned organic electroluminescence device 5 as an example, the resistance of the HIL 51 can be adjusted to higher than about 1.00E+9 ohms by adjusting the thickness of the HIL 51 to a range from about 50 to 5000 Å, preferably from about 1000 to 2000 Å, such as 1500 Å. Alternatively, the concentration of the conductive dopants can be adjusted to a relatively low level. Taking the P-type dopant F4 as an example, the concentration of F4 can be adjusted to 2~5%, preferably to 3~4%, such that the resistance of the HIL 51 is adjusted to a relatively high level that is preferably higher than about 1.00E+9 ohms.

In accordance with the above-mentioned organic electroluminescence device and the method for reducing lateral current leakage thereof, the lateral current leakage can be effectively restrained by adjusting the resistance of an HIL without affecting the working voltage, thermal stability, and/or life of the device. Indeed, the light leakage of the OLED on each pixel area can be improved, and the efficiency of the device can be enhanced.

The above disclosure is related to the detailed technical contents and inventive features thereof. People having ordinary skills in this field may proceed with a variety of modifications and replacements based on the disclosures and suggestions of the invention as described without departing from the characteristics thereof. Although such modifications and replacements are not fully disclosed in the above descriptions, they have substantially been covered in the appended claims.

What is claimed is:

1. An organic electroluminescence device comprising:
   a cathode;
   an anode; and
   an organic electroluminescence unit disposed between the cathode and the anode;
   wherein the organic electroluminescence unit comprises a light-emitting layer and a hole-injecting layer (HIL) possessing a sufficient resistance for restraining lateral current leakage, and the HIL is doped with a conductive material comprising a P-type dopant.

2. The organic electroluminescence device as claimed in claim 1, wherein the resistance of the HIL is higher than about 1.00E+9 ohms.

3. The organic electroluminescence device as claimed in claim 1, wherein the thickness of the HIL ranges from about 50 to 5000 angstroms (Å).

4. The organic electroluminescence device as claimed in claim 3, wherein the thickness is about 1500 angstroms (Å).

5. The organic electroluminescence device as claimed in claim 1, wherein the organic electroluminescence unit further comprises at least one of a hole-transporting layer (HTL), an electron-transporting layer (ETL), and an electron-injecting layer (EIL).

6. The organic electroluminescence device as claimed in claim 1, wherein the P-type dopant comprises fluoro-7,7,8,8-tetracyanoquinodimethane (F4).

7. The organic electroluminescence device as claimed in claim 6, wherein the concentration of the P-type dopant ranges from about 2% to 5%.

8. The organic electroluminescence device as claimed in claim 7, wherein the concentration of the P-type dopant ranges from about 3% to 4%.

* * * * *